(12) United States Patent
Zhao et al.

(10) Patent No.: US 10,153,343 B2
(45) Date of Patent: Dec. 11, 2018

(54) TUNNEL FIELD-EFFECT TRANSISTOR AND METHOD FOR PRODUCING SAME

(71) Applicant: Forschungszentrum Juelich GmbH, Juelich (DE)

(72) Inventors: Qing-Tai Zhao, Juelich (DE); Siegfried Mantl, Juelich (DE); Sebastian Blaeser, Neuss (DE)

(73) Assignee: FORSCHUNGSZENTRUM JUELICH GMBH, Juelich (DE)

( * ) Notice: Subject to any disclaimer, the term of this patent is extended or adjusted under 35 U.S.C. 154(b) by 0 days.

(21) Appl. No.: 15/535,437

(22) PCT Filed: Nov. 4, 2015

(86) PCT No.: PCT/DE2015/000531
§ 371 (c)(1),
(2) Date: Jun. 13, 2017

(87) PCT Pub. No.: WO2016/095885
PCT Pub. Date: Jun. 23, 2016

(65) Prior Publication Data
US 2017/0365663 A1    Dec. 21, 2017

(30) Foreign Application Priority Data

Dec. 15, 2014  (DE) .......... 10 2014 018 382

(51) Int. Cl.
*H01L 29/08*   (2006.01)
*H01L 29/06*   (2006.01)
(Continued)

(52) U.S. Cl.
CPC ...... *H01L 29/0847* (2013.01); *H01L 29/0673* (2013.01); *H01L 29/66356* (2013.01);
(Continued)

(58) Field of Classification Search
CPC ............... H01L 29/0847; H01L 29/78; H01L 29/66484; H01L 29/7831; H01L 27/11536;
(Continued)

(56) References Cited

U.S. PATENT DOCUMENTS 8,258,031 B2   9/2012 Lauer et al.
8,384,122 B1   2/2013 Hu et al.
(Continued)

FOREIGN PATENT DOCUMENTS

DE    102011119497 A1    5/2013

OTHER PUBLICATIONS

Krishna K. Bhuwalka, et al., "P-Channel Tunnel Field-Effect Transistors down to Sub-50 nm Channel Lengths", Japanese Journal of Applied Physics, vol. 45, part 1, No. 4B, Apr. 25, 2006, pp. 1-5.
(Continued)

*Primary Examiner* — Changhyun Yi
(74) *Attorney, Agent, or Firm* — Leydig, Voit & Mayer, Ltd.

(57) ABSTRACT

A method for producing a tunnel field-effect transistor (TFET) having a source region, a channel region, and a drain region includes arranging an epitaxial layer on a silicon substrate; applying a gate arrangement having a gate electrode to the epitaxial layer, a gate dielectric being arranged between the gate electrode and the silicon substrate; forming a doped pocket region below the gate dielectric adjacent to the source region; forming a selectively silicidated region in the source region, the selectively silicidated region extending as far as to below a gate; and forming a counter-doped region doped in an opposite way to the pocket region adjacent to the pocket region in the source region by diffusion of dopants out of the silicidated region, as a result
(Continued)

of which a tunnel junction parallel to the electric field lines of the gate electrode is achieved.

19 Claims, 9 Drawing Sheets

(51) Int. Cl.
    *H01L 29/66* (2006.01)
    *H01L 29/78* (2006.01)
    *H01L 29/739* (2006.01)

(52) U.S. Cl.
    CPC .... *H01L 29/66795* (2013.01); *H01L 29/7391* (2013.01); *H01L 29/78* (2013.01)

(58) Field of Classification Search
    CPC ............. H01L 21/28282; H01L 29/782; H01L 29/792; H01L 29/7845; H01L 29/665
    See application file for complete search history.

(56) References Cited

U.S. PATENT DOCUMENTS

| | | |
|---|---|---|
| 2009/0101972 A1 | 4/2009 | Gaines et al. |
| 2011/0147838 A1* | 6/2011 | Gossner ............ H01L 29/66356 257/345 |
| 2011/0278542 A1 | 11/2011 | Bangsaruntip et al. |
| 2012/0193678 A1* | 8/2012 | Lauer .................... H01L 29/165 257/192 |
| 2012/0199917 A1 | 8/2012 | Morooka |
| 2012/0228706 A1* | 9/2012 | Sugizaki ............. H01L 29/0657 257/345 |
| 2014/0054657 A1 | 2/2014 | Hokazono et al. |

OTHER PUBLICATIONS

Krishna K. Bhuwalka, et al., "Vertical Tunnel Field-Effect Transistor with Bandgap Modulation and Workfunction Engineering", Solid-State Device Research Conference, 2004. ESSDERC 2004. Proceeding of the 34$^{th}$ European, Sep. 23, 2004, pp. 241-244.

Chenming Hu, "Green Transistor as a Solution to the IC Power Crisis", Solid-State and Integrated-Circuit Technology, 2008. ICSICT 2008. 9$^{th}$ International Conference on, Oct. 20-23, 2008, pp. 1-4.

Kanghoon Jeon, et al., "Si Tunnel Transistors with a Novel Silicided Source and 46MV/dec Swing", VLSI Technology (VLSIT), 2010 Symposium on, Jun. 15-17, 2010, pp. 121-122.

Lars Knoll, et al., "Inverters With Strained Si Nanowire Complementary Tunnel Field-Effect Transistors", IEEE Electron Device Letters, vol. 34, No. 6, Jun. 2013, pp. 813-815.

Lars Knoll, et al., "Si tunneling transistors with high on-currents and slopes of 50 mV/dec using segregation doped Nisi2 tunnel junctions", Solid-State Device Research Conference (ESSDERC), 2012 Proceedings of the European, Sep. 17-21, 2012, pp. 153-156.

Siegfried Mantl, et al., "Si based tunnel field effect transistors: Recent achievements", Ultimate Integration on Silicon (ULIS), 2013 14$^{th}$ International Conference on, Mar. 19-21, 2013, pp. 15-20.

M. Schmidt, et al., "Impact of strain an Ge concentration on the performance of planar SiGe band-to-band-tunneling transistors", Solid-State Electronics 71, Dec. 2012, pp. 42-47.

Amey M. Walke, et al., "Fabrication and Analysis of a Si/Si0.55Ge0. 45 Heterojunction Line Tunnel FET", IEEE Transactions on Electron Devices, vol. 61, No. 3, Mar. 2014, pp. 707-715.

* cited by examiner

TUNNEL FIELD-EFFECT TRANSISTOR AND METHOD FOR PRODUCING SAME

CROSS REFERENCE TO RELATED APPLICATIONS

This application is a U.S. National Phase application under 35 U.S.C. § 371 of International Application No. PCT/DE2015/000531, filed on Nov. 4, 2015, and claims benefit to German Patent Application No. DE 10 2014 018 382.3, filed Dec. 15, 2014. The international application was published in German on Jun. 23, 2016, as WO 2016/095885 A1 under PCT Article 21(2).

FIELD

The invention relates to a tunnel field-effect transistor (TFET) having a vertical tunnel path and to a method for producing such tunnel field-effect transistors (TFET).

BACKGROUND

Transistors that are more energy-efficient are essential for the development of increasingly powerful mobile devices and of higher performance computers. The constant decrease in the size of transistors and the increase in packing density of over $10^9$ transistors per chip brings about energy consumption that is too high and, as a result, a problematic generation of heat. Although conventional field-effect transistors (MOSFETs) are constantly being improved and energy consumption also reduced as a result, the switching behavior limits energy efficiency in principle. This is to do with the thermally distributed energy distribution at ambient temperature of the charge carriers injected into the transistor channel. The switching behavior can be described by the "inverse subthreshold slope" (S), which states by how many millivolts (mV) the gate voltage must be increased in order to increase the output current (Ion) by a decade (dec). At ambient temperature, this results in a minimum S of 60 mV/dec. In the case of short-channel transistors, such as those used in high performance processors, short-channel effects increase S to about 100 mV/dec at a gate length of 32 nm. These basic limits also increase the off current ($I_{off}$) at a given threshold voltage, and therefore increase the losses too.

In order to reduce the energy consumption of transistors, the operating voltage (=drain voltage ($V_{dd}$)) and the inverse subthreshold slope (S) should be reduced. The dynamic energy consumption is scaled by the square of $V_{dd}$; if the switching frequency is also taken into account, it is even scaled by the cube of $V_{dd}$. A reduction in S allows a reduction in the threshold voltage without a substantial rise in $I_{off}$.

In order to meet these requirements, a new kind of switch element known as a "steep slope device" is required. The most promising concepts include "band-to-band tunneling (BTBT) transistors", referred to here as tunnel FETs (TFET), and MOSFETs having an upstream energy filter. The latter have not yet been achieved owing to enormous technological problems. Tunnel field-effect transistors produced to date have generally not met expectations yet since the output currents are too small and S is only in a non-usable low gate voltage range of <60 mV/dec.

Figure 1:
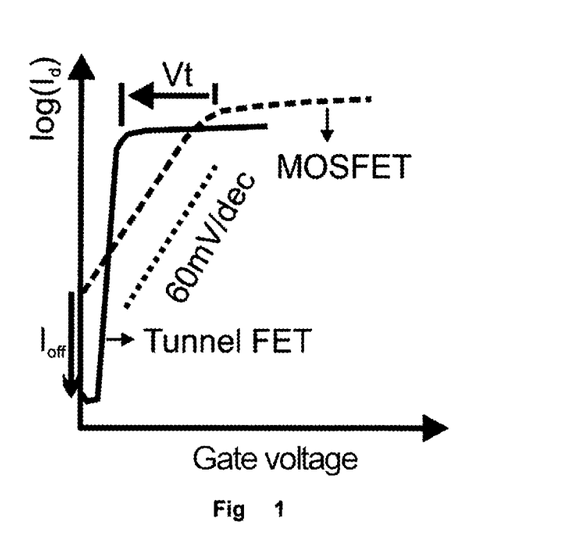
FIG. 1 is a schematic view of the switching behavior of standard MOSFETs and band-to-band tunnel transistors (TFET) on the basis of a transfer characteristic.

FIG. 1 schematically illustrates the switching behavior of a conventional MOSFET and of a tunnel field-effect transistor. The transfer characteristic of the current on the drain side ($I_d$) is shown against the gate voltage. The dashed line shows the minimum inverse subthreshold slope S for MOSFETs at 60 mV/dec. $V_t$ denotes the threshold voltage. According to simulation calculations, tunnel field-effect transistors can achieve S<60 mV/dec. Moreover, the tunnel field-effect transistor can already be fully switched on at much lower gate voltages. As a result, the threshold voltage $V_t$ can be reduced in comparison to MOSFETs (owing to the lower S) without increasing $I_{off}$, and therefore higher energy efficiency can be achieved.

Figure 2:
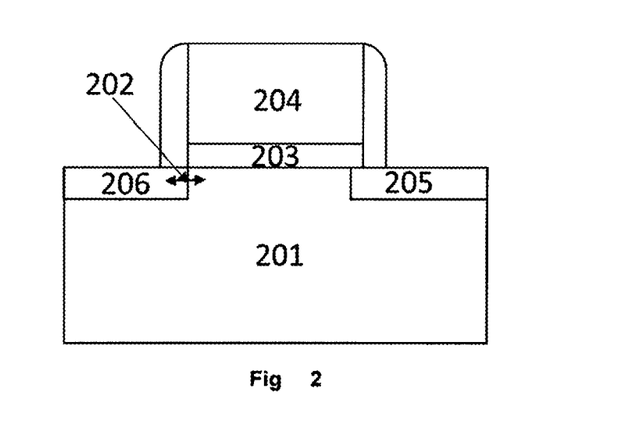
FIG. 2 shows a tunnel field-effect transistor from the prior art.

FIG. 2 shows the basic construction of a planar tunnel field-effect transistor consisting of a source-channel-drain structure, for example a p-i-n structure, having a gate arrangement 203, 204, the gate arrangement advantageously comprising a gate dielectric 203 having high permittivity (k), such as $HfO_2$. The gate contact (gate electrode) 204 is achieved with the aid of a metal layer (for example, TiN). The source 206 and drain 205 are interchangeable in the case of transistors having a symmetrical construction. The tunnel junction 202 can be achieved either on the source side or on the drain side. 201 indicates intrinsic silicon.

For the purpose of simplification, the tunnel junction at the source-to-channel junction is selected for this prior art. The transistor is reverse-biased, so for a p-TFET the $n^+$-doped source is set at V=0 and a negative voltage is applied at the $p^+$-doped drain and the gate. Similarly, for an n-TFET, the polarity of the source and drain and of the drain and gate voltage are interchanged. As a result, the conduction and valence band is normally increased in the channel and drain region. When voltages are sufficiently high, an electronic band profile is produced in which the minority charge carriers (in this case, holes) tunnel from the conduction band of the source into the valence band of the channel material. The tunnel probability $T_{WKB}$ according to the WKB approximation is given by:

$$T_{WKB} \approx \exp\left(-\frac{4\Lambda\sqrt{2m*}\,E_g^{3/2}}{3q\hbar(\Delta\Phi + E_g)}\right)$$

In the equation, $\Lambda$ denotes the natural length, m* the effective mass of the charge carriers, $E_g$ the band gap, $\Delta\Phi$ the potential difference between the valence band lower edge in the channel and the conduction band upper edge in the source, q the electron charge and h the Planck constant divided by $2\pi$. The natural length $\Lambda$ is the sum of $\Lambda_g$ and $\Lambda_{ch}$. The first summand $\Lambda_g$ is a measurement for the electrostatic control of the transistor by the gate; the second summand $\Lambda_{ch}$ describes the steepness of the tunnel junction.

The field dependency of the tunnel current is given by the Kane model. Accordingly, band-to-band tunneling increases exponentially with the electrical field at the tunnel junction. Using simulation calculations, it was calculated that fringing fields starting from a gate dielectric having very high permittivity lead to better characteristics.

L. Knoll, Q. T. Zhao, Lars Knoll, A. Nichau, S. Trellenkamp, S. Richter, A. Schäfer, D. Esseni, Selmi, K. K. Bourdelle, S. Mantl, "Inverters With Strained Si Nanowire Complementary Tunnel Field-Effect Transistors", IEEE ELECTRON DEVICE LETTERS vol. 34, no. 6, pp. 813-815, 2013. Nanowire band-to-band tunnel field-effect transistors achieved to date demonstrated inverse subthreshold slopes S of less than 60 mV/dec, which are largely attributable to the improved steepness of the tunnel junction owing to the use of a silicided source region having subsequent dopant segregation, only in the case of very low drain currents.

TFETs have also been proposed and produced having semiconductors that have smaller band gaps. A simulation for a planar TFET having silicon germanium (Si—Ge) has become known from K. Bhuwalka et al. (P-Channel Tunnel Field Effect Transistors down to Sub-50 nm Channel Length" Jap. J. of Appl. Physics 45 (2006) pages 3106-3109), with which the benefit of the smaller band gap could be proven. Experimental results from M. Schmidt, R. A. Minamisawa, S. Richter, R. Luptak, J.-M. Hartmann, D. Buca, Q. T. Zhao and S. Mantl "Impact of strain and Ge concentration on the performance of planar SiGe band-to-band-tunneling transistors", Proc. of ULIS 2011 Conference, confirm this benefit, albeit with S>60 mV/dec. In this approach, source, channel and drain made from a SiGe alloy having a Ge content of 30-65 at. % were investigated.

Vertical $In_{0.53}Ga_{0.47}As_{0.47}$ band-to-band tunnel field-effect transistors disadvantageously have not delivered the expected results to date either.

A more in-depth approach by C. Hu "Green Transistor as a solution to the IC Power Crisis", Proc. of ICSICT Conference, Peking, 2008 (978-1-4244-22186-2/08 @2008 IEEE), uses a complicated heterostructure, in which a thin layer of $n^+$-doped strained silicon is placed on $p^+$-doped Ge below the gate on the source side about as far as to the center of the gate of the transistor. This results in a tunnel junction consisting of $p^+$—Ge/$n^+$-strained silicon. This approach has the aforementioned advantages of the integration of a material having smaller band gaps in the tunnel region, and also the surface of the tunnel junction is enlarged as a result of the integration below the gate. A big disadvantage of this concept is the difficult implementation, which has prevented it from being achieved to date.

Even the proposal by Bhuwalka et al. (Proc. ESSDERC 2004, 0-7803-8478-4/04@2004 IEEE) of introducing an ultrathin SiGe delta layer having sharp boundaries at the tunnel junction in order to improve the tunnel current only leads to small improvements.

The production of a TFET in which the tunnel junction extends in parallel with the electric field of the gate is known from U.S. Pat. No. 8,258,031 B2. The vertical tunnel junction having a counter-doped pocket increases the tunnel cross-sectional area and therefore the tunnel current. The production method starts in this case with a silicon on insulator (SOI) layer. The highly-doped tunnel junction is obtained by selective growth, which can disadvantageously generate a tunnel boundary having a higher defect density. This in turn leads to a tunnel process across these defects and therefore to a large inverse subthreshold slope (S).

The publication by Kanghoon Jeon, Wei-Yip Loh, Pratik Patel, Chang Yong Kang, Jungwoo Oh, Anupama Bowonder, Chanro Park, C. S. Park, Casey Smith, Prashant Majhi, Hsing-Huang Tseng, Raj Jammy, Tsu-Jae King Liu, and Chenming Hu, "Si Tunnel Transistors with a Novel Silicided Source and 46 mV/dec Swing", 2010 Symposium an VLSI Technology Digest of Technical Papers, page 121-122) reports on TFETs having a homojunction, which have a source region silicided with NiSi. The special shape of the edges of the silicided region is not reproducible, however, if the thickness or width of the silicon layer is varied.

SUMMARY

In an embodiment, the present invention provides a method for producing a tunnel field-effect transistor (TFET) comprising a source region, a channel region, and a drain region. The method includes arranging an epitaxial layer on a silicon substrate; applying a gate arrangement having a gate electrode to the epitaxial layer, a gate dielectric being arranged between the gate electrode and the silicon substrate; forming a doped pocket region below the gate dielectric adjacent to the source region; forming a selectively silicided region in the source region, the selectively silicided region extending as far as to below a gate; and forming a counter-doped region doped in an opposite way to the pocket region adjacent to the pocket region in the source region by diffusion of dopants out of the silicided region, as a result of which a tunnel junction parallel to the electric field lines of the gate electrode is achieved.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

A tunnel field-effect transistor (TFET) is described herein in which the width of the tunnel barrier and the size of the tunnel region can be adjusted effectively by orienting the tunnel current in relation to the electric field of the gate electrode.

A production method for the aforementioned tunnel field-effect transistor is described herein that is not very demanding in terms of technology.

A tunnel field-effect transistor (TFET) is described herein, which can be achieved in a planar configuration as well as using nanowires. Said transistor consists of a source region (source), a drain region (drain) and a channel, thereby producing a p-i-n structure. Normally, doped regions for defining the source and drain are spatially separated from one another by an undoped channel in the process. There is a dielectric adjacent to the channel, which dielectric spaces a control electrode (gate) for controlling the transistor from the channel. Hereinafter, the terms source, drain and gate are used throughout.

Tunnel field-effect transistors (TFETs) according to embodiments of the invention can have, in particular, two advantages over the current prior art. Firstly, a shortened tunnel barrier and thus a shortened tunnel junction can be provided. This can be produced according to the invention by silicidation and additionally dopant segregation being provided in the source region, which bring about a steeper tunnel edge.

Figure 3:
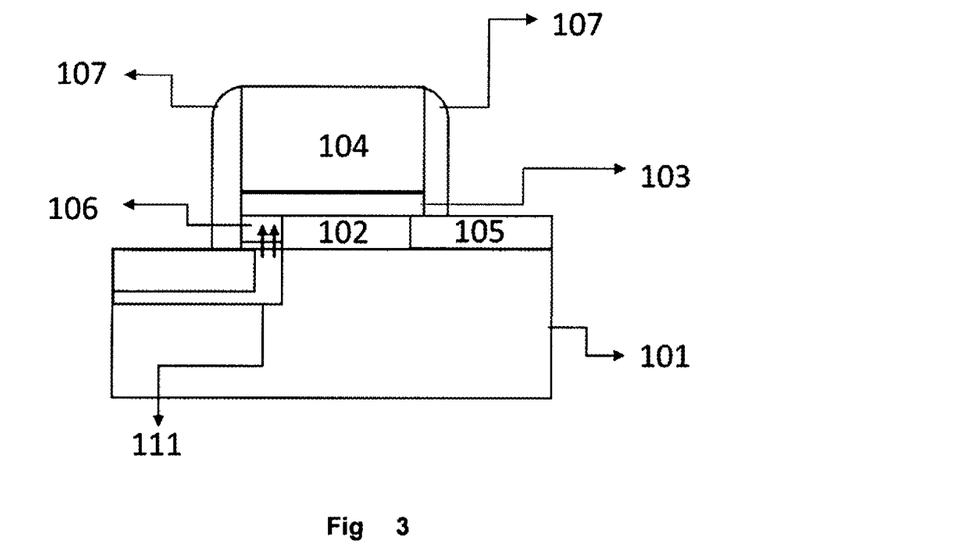
FIG. 3 shows a tunnel field-effect transistor according to an embodiment of the invention.

Secondly, the tunnel surface itself can be enlarged by means of selective and self-adjusting silicidation, providing a tunnel junction that extends in parallel with the electric field lines of the gate in the tunnel field-effect transistor (TFET) according to embodiments of the invention. This is known in literature by the term "line tunneling" as opposed to "point tunneling". The tunnel field-effect transistor (TFET) according to embodiments of the invention thus combines a tunnel junction parallel to the electric field lines of the gate and having an enlarged tunnel region below the gate with a material that has a narrower band gap, as shown schematically in FIG. 3.

Said tunnel junction is achieved in a material having a small band gap, for example in a thin SiGe layer which has grown pseudomorphically on a silicon layer and offers a smaller band gap as a result of biaxial compressive strain. Although the invention is described in more detail below with reference to an SiGe layer, a person skilled in the art knows that other typical materials such as Si—Ge—Sn or just Ge are also possible for the epitaxial layer besides SiGe.

In the process, the thickness of the material of the epitaxial layer having a small band gap should not exceed 10 nm in order to allow for a depletion of the charge carriers necessary for the tunneling process, with the aid of the electric field of the control electrode. The silicon layer can, for example, be a silicon on insulator layer (SOI); however, the invention is not limited to this substrate, but rather can also be transferred to standard silicon substrates.

In a process according to embodiments of the invention, doping is undertaken, starting from the source region, and this undercuts the dielectric of the gate (pocket region) and thus allows an enlarged tunnel region. In such a process, doping is not limited to the option of ion implantation but rather can also be implemented using in situ doping during the growth of the SiGe layer given by way of example. According to embodiments of the invention, doping reaches as far as to underneath the dielectric in order to allow a tunnel junction parallel to the electric field lines of the gate.

If the doping was carried out using ion implantation, for example, the dopants can be activated by means of inert atmosphere tempering at low temperatures (<900° C.) in order to obtain the compressive biaxial strain of the SiGe layer, given by way of example, as a result of the pseudomorphic growth.

On the source side, the doped region of the epitaxial layer, for example the SiGe layer, is removed as far as to the edge of the gate such that only a correspondingly doped pocket remains below the gate.

According to embodiments of the invention, a counter-doped region adjacent to the pocket region is subsequently created additionally in the source region, as a result of which a $p^+$-$n^+$ tunnel junction and therefore the tunneling parallel to the electric field lines of the control electrode are achieved.

In a first embodiment of the invention, the sides of the gate are additionally provided with an insulating layer, a "spacer", which reaches as far as to the doped SiGe layer on the drain side and as far as to the silicon layer on the source side. The silicon layer on the source side is subsequently provided with a metal layer.

In the process, when selecting the metal, care must be taken to ensure that it only reacts with the silicon in the subsequent silicidation stage and not with the SiGe layer given by way of example, and thus allows self-adjusting, selective silicidation in relation to the material in which the actual tunneling process takes place. In the case of an SiGe layer, cobalt in particular is suitable as a metal for self-adjusting, selective silicidation. The actual silicidation stage takes place again at low temperatures under forming gas in order to obtain the compressive biaxial strain of the SiGe layer, given by way of example, as a result of the pseudomorphic growth. Normally, the silicidation takes place laterally as far as to below the gate in order to generate as large a tunnel surface as possible.

Afterwards, implantation is carried out into the silicide only, with the aid of an implantation mask. There follows a subsequent tempering stage at low temperatures, during which these dopants diffuse (segregate) out of the silicide into the SiGe layer, given by way of example, in order to generate a sharp $p^+$-$n^+$ tunnel junction parallel to the electric field lines of the control electrode. In this case, the process is not limited to a diffusion of the dopants out of the silicide, but rather can also be achieved by an initial doping of the silicon layer and subsequent silicidation (see second embodiment). In the process, the selection of the suitable temperature and the corresponding time for the dopant segregation influence how far the dopants diffuse out of the silicide into the neighboring pocket region, and can be determined experimentally beforehand if necessary by a person skilled in the art.

Figure 4:
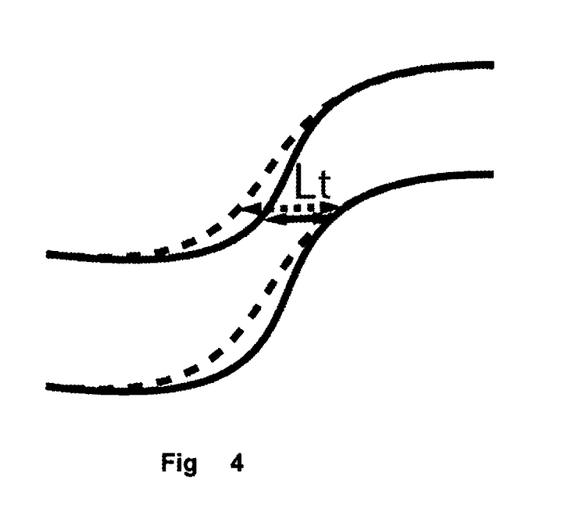
FIG. 4 is a schematic view of a band model for TFET arrangements with and without the presence of a counter-doped pocket.

The band diagram of a tunnel junction is shown schematically in FIG. 4. The width of the tunnel barrier is given as Lt. Clearly visible is the lower width of the tunnel barrier which occurs in the presence of a counter-doped pocket region (solid lines) owing to the narrower depletion zone, as provided according to the invention, in comparison to an arrangement known from prior art without a counter-doped pocket region (dashed lines).

Figure 5:
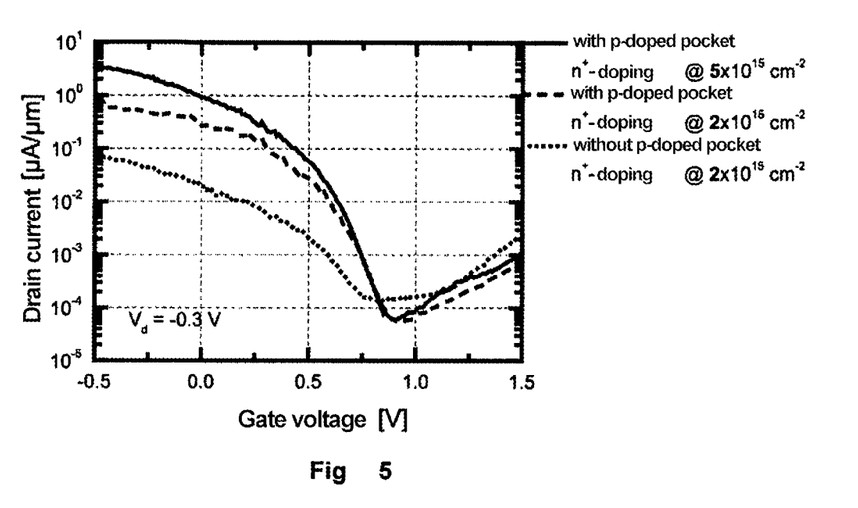
FIG. 5 shows the transfer characteristic of a planar p-type TFET without and with two embodiments of the invention each having p-doped pockets directly below the gate, two different doping strengths having been tested for the doping of the source region.

In the process, the self-adjusting diffusion out of the silicide generates the source doping necessary for the TFET (lower curve in FIG. 5). The counter-doping of the pocket thereabove increases the field strength in the tunnel junction such that the tunnel current rises further (dashed and dotted lines in FIG. 5). In this connection, the term selective self-adjusting silicidation means that the special silicide does not impair the (example) SiGe layer (selectively) since the metal does not react with the SiGe layer, and that the doping of the tunnel junction is generated in a self-adjusting manner by the doping and subsequent diffusion.

Figure 6:
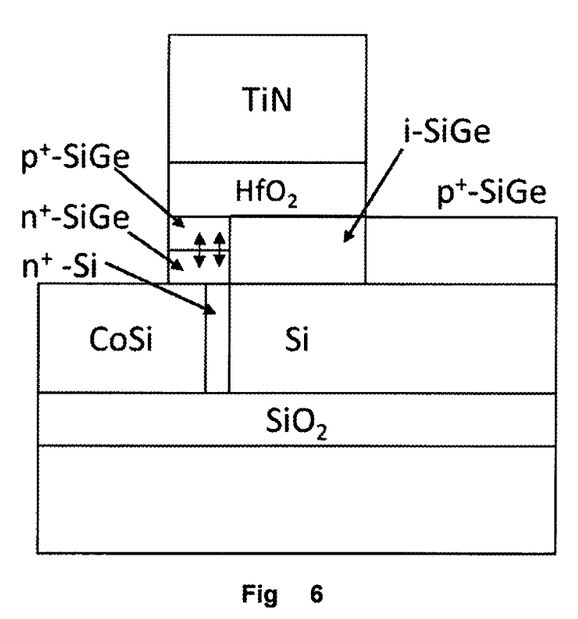
FIG. 6 shows the schematic construction of a tunnel field-effect transistor according to the invention having an $n^+$-i-$p^+$ structure.

In the process, the self-adjusting process during production of the tunnel junction is a substantial advantage of the production method according to the invention. As a result of said process, it is possible to reproducibly produce the tunnel junction, i.e. the dividing line between the p-n regions, as shown in FIG. 6, to an accuracy of a few nanometers.

If the tunnel junction is generated by means of silicidation and subsequent doping segregation at low temperatures (<700° C.), it is many times sharper than is possible using conventional methods such as purely ion implantation. Said sharper tunnel junction results in a shorter tunnel barrier Lt owing to a reduced natural length $\Lambda$ or, specifically, $\Lambda_{ch}$, in accordance with equation (1). By introducing a counter-doped pocket, this tunnel barrier Lt is shortened still further.

Furthermore, dopant segregation following silicidation does not just bring about an advantageous, sharper tunnel connection, it also allows higher absolute dopant concentrations at the tunnel connection, which makes it possible to achieve a linear output characteristic of the TFET.

A further advantage of production methods according to embodiments the invention can be that as a result of the self-adjusting diffusion out of the silicide—contrary to in situ doping—a tunnel junction that is particularly low in defects can be generated.

The tunnel junction according to embodiments of the invention can be implemented in planar 1-gate transistors as well as in multi-gate nanowires (core-shell nanowire field-effect transistors). Depending on the configuration, different variations of production are available accordingly.

The region where the current flows into the transistor is referred to as the source region and the region where the current flows out of the transistor is referred to as the drain region. The current flow between the drain and source is controlled or strengthened as a result of targeted enlargement and shrinkage of conductive and non-conductive regions of the semiconductor material (substrate). In the process, the semiconductor material, which is normally p and n-doped beforehand, is either depleted or enriched with charge carriers by the voltage applied at the control electrode (gate) or the resultant electric field.

FIG. 5 shows the transfer characteristic (drain current $I_d$ against gate voltage $V_g$) of a planar p-type TFET without and with two embodiments of the invention in the form of p-doped pockets directly below the gate, two different doping strengths having been tested for the doping of the source region. The SiGe layer having 55 at. % Ge has a starting layer thickness of 5 nm. The on-current (drain current) for the configuration having a counter-doped pocket rises by almost two orders of magnitude in this experiment and the inverse subthreshold slope S improves from 200 mV/dec to 100 mV/dec. An improved technological design will lead to S<60 mV/dec and thus to particularly energy efficient transistors. The drop in the off-current (minimum current) can also be seen clearly for the two embodiments of the invention compared to a transistor without a p-doped pocket. In this way, the ratio of limiting current to minimum current can be increased advantageously by at least a factor of 50 in the case of the transistors according to embodiments of the invention. The ambipolar behavior that is typical of TFETs is also suppressed when a pocket is used, since the advantageous line tunneling takes place on the source side whereas point tunneling takes place on the drain side.

FIG. 6 shows the schematic construction of an embodiment of the band-to-band tunnel field-effect transistor (TFET) according to embodiments of the invention having a vertical tunnel junction. The gate arrangement is formed from a highly permissive gate dielectric ($HfO_2$) and a metal gate made from TiN. The channel region of i-SiGe is intrinsic, i.e. nominally undoped; the drain region in this example is p-doped. The p-doped pocket is arranged below the gate on the source side. According to embodiments of the invention, said pocket is adjacent to the counter-doped (n-doped) region, which has formed by the diffusion of the dopant out of the silicided region, and there forms the vertical tunnel junction which normally extends over a region in the order of about 10 nm.

Hereinafter, the individual steps of the method for producing a TFET according to an embodiment of the invention are described by way of example with reference to a planar TFET in FIG. 7 to 12, without this constituting a restriction of the production variations.

Figure 7:
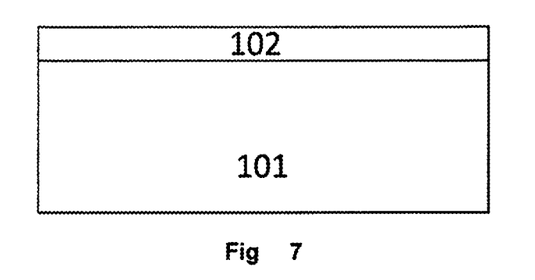
FIG. 7-14 are schematic illustrations of the production of a planar TFET according to an embodiment of the invention.

In FIG. 7, the Si(100) substrate 101 is shown having a semiconducting functional layer (silicon-germanium layer, $Si_{1-x}Ge_x$, where 0<x<1) 102 arranged thereon. The SiGe layer was pseudomorphically grown on a silicon substrate 101. In the process, the compressive biaxial strain in the SiGe layer reduces the band gap in comparison to relaxed SiGe owing to the pseudomorphic growth.

Figure 8:
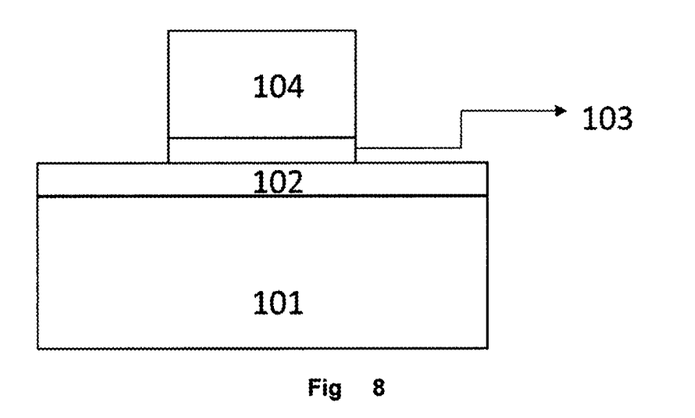

According to FIG. 8, the gate 104 was first produced according to standard MOSFET production on the silicon substrate 101 having the thin, for example 5 nm thick, SiGe layer 102 arranged thereon. For this purpose, the following layers were deposited on the whole of the silicon-germanium layer 102. The gate dielectric $HfO_2$ was deposited about 2 to 4 nm thick onto the thin SiGe layer 102, the later channel, by means of atomic layer deposition (ALD). The TiN gate 104 was applied by means of pulsed vapor deposition. The entire gate consisting, for example, of TiN and polysilicon normally has a total layer thickness of between 40 and 150 nm. The gate was subsequently structured by means of reactive ion etching and selective wet chemicals.

Figure 9:
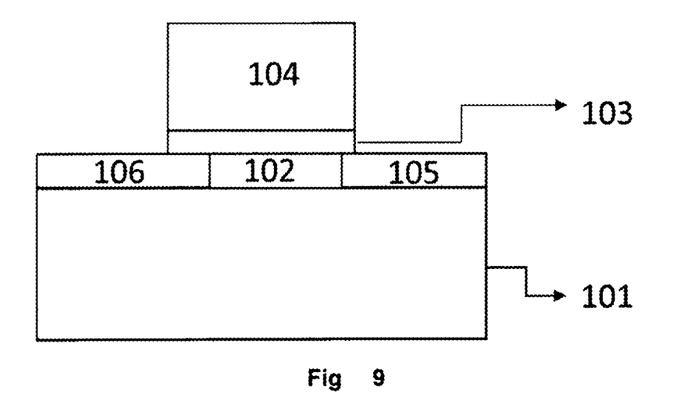

FIG. 9 shows the next method step, in which the silicon-germanium layer 102 undergoes doping. Borate ions were implanted in the SiGe layer, in order to form a p-doped depression (right side) and a p-doped pocket (left side) directly below the control electrode. In the process, the energy was consciously selected so as to be low enough to only implant or dope the SiGe layer and not the underlying silicon. In addition, the dopants were activated at low temperatures (<900° C.) in order to prevent relaxation of the biaxially compressive strain of the SiGe layer.

Figure 10:
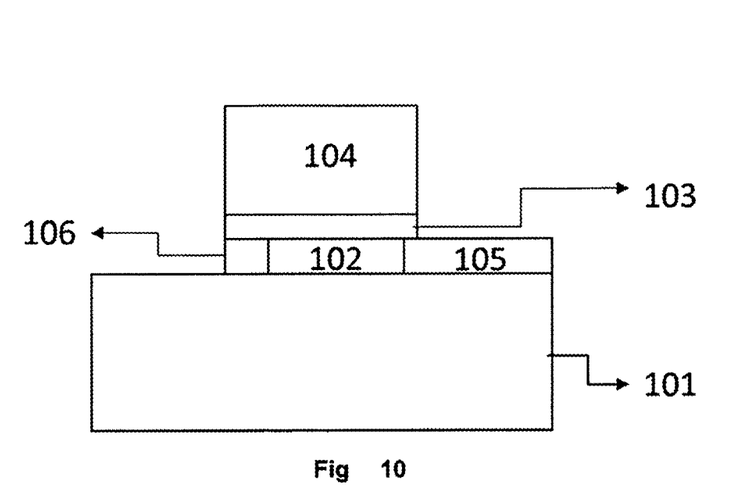

FIG. 10 shows how the p-doped region 106 was subsequently fully removed afterwards as a result of a dry etching step as far as to the region directly below the gate. In the process, the dry etching did not take place as far as to under the dielectric 103 and the gate 104. Therefore, a p-doped pocket 106 remains below the gate.

Moreover, to remove the p-doped region as far as to the silicon layer 101 it is advantageous if the original SiGe layer 102 is not thicker than 10 nm in order to allow depletion of the charge carriers therein as a result of the electric field of the control electrode.

For the next step (see FIG. 11) of the silicidation of the source region, laterally arranged oxide spacers 107 of $SiO_2$ or silicon nitride were used. The oxide spacers were produced according to the standard process of MOSFET technology. Furthermore, the oxide spacers 107 also protect the dielectric 103 and the gate 104.

Figure 11:
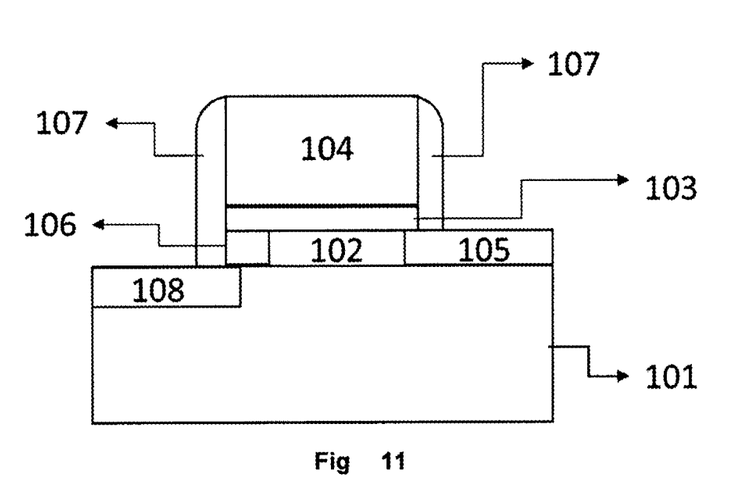

Subsequently, a metal was applied to the silicon layer 101, which was exposed following etching, by means of electron beam evaporation. In the process, suitable metals are those that react with the silicon of the Si layer but not with the SiGe layer; the SiGe layer should be understood as being an example. Cobalt is suitable for the material system Si—SiGe since the formation of cobalt silicide on the Si/SiGe border advantageously stops by itself. Ge is not incorporated into the silicide. In contrast, Ni, which is usually used for silicidation, would form an Ni—Si—Ge compound and therefore affect the SiGe channel layer. An additional layer can optionally be applied to the first metal layer to protect it from oxidation.

After this, the source region underwent a silicidation step in which the metal from the metal layer diffuses into the silicon layer and forms a metal compound, a silicide, with the silicon. This produced the silicide region 108, which can undercut the oxide spacer 107 on the source side as well as the pocket region 106.

Figure 12:
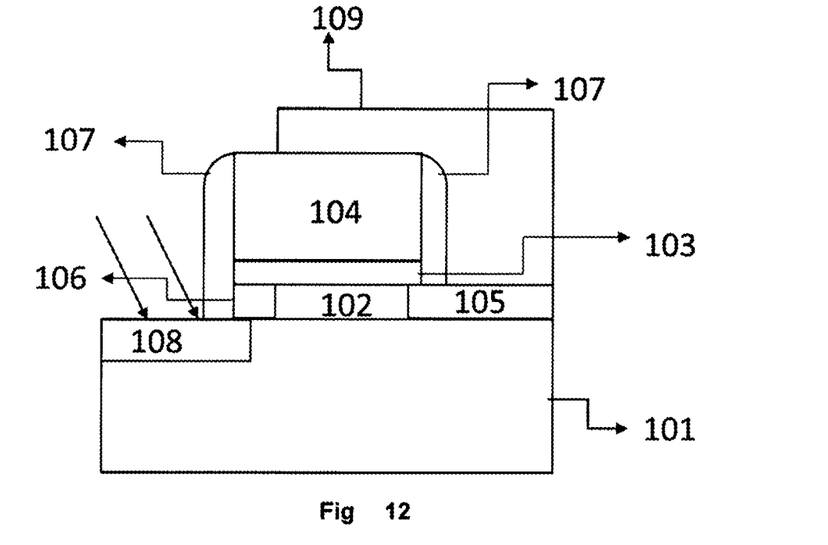

A mask 109 limits the subsequent doping to the source region. This can be achieved by ion implantation with subsequent temperature treatment or by other dopant diffusion processes. In the process, the doping on the source side takes place in the opposite way to the doped pocket 106 and the drain region 105, in this case therefore as n-doping using phosphorous.

Directly after the doping of the silicided region 108 with the phosphorous ions, the transistor was treated at 500° C. for 10 seconds in a nitrogen atmosphere, the phosphorous diffusing out of the cobalt silicide 108 into the Si substrate 101, on the one hand, and crucially sideways and upwards as far as into the p-doped SiGe layer (doped pocket) 106. In the case of this method, it is advantageous that the diffusion of, for example, the phosphorous out of the silicide can be controlled exactly, to an accuracy of a few nanometers, by the thermal budget (for example, 500° C. for 10 s), the steep doping profiles which are important for tunnel FETs can be produced, and the thermal diffusion does not generate any crystal defects in the SiGe layer in contrast to direct ion implantation. This is important in order to minimize unwanted defect-induced tunneling, which degrades the S of tunnel FETs.

By selecting the method parameters, it is thus advantageously possible for the phosphorous to only diffuse a few nanometers into the SiGe of the counter-doped pocket region such that the p-n junction (=tunnel junction) preferably forms roughly in the center of the SiGe layer.

Figure 13:
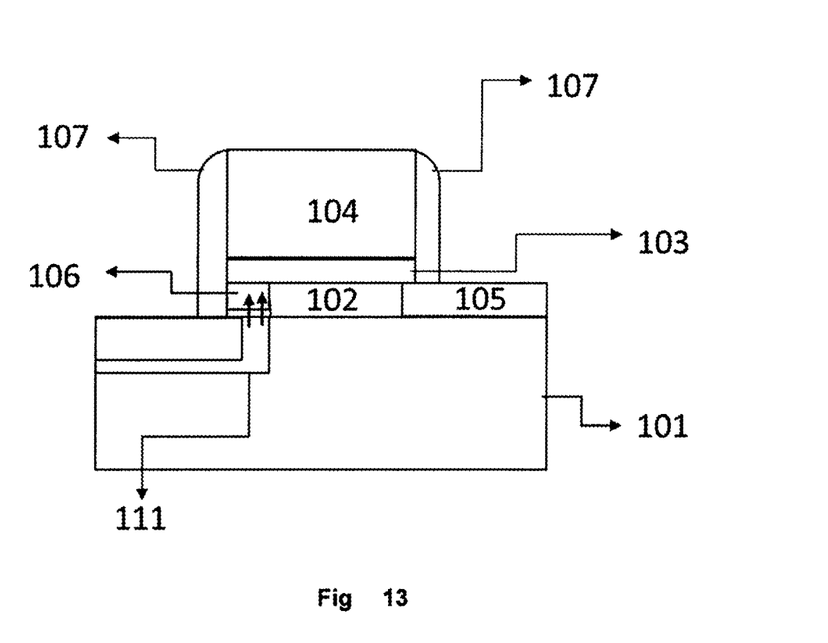

In this way, it was possible to form a vertical $n^+$-p band-to-band tunnel junction (indicated by arrows in FIG. 13) within the SiGe layer and directly below the gate. The dopant concentration of the $n^+$ source region 111 should be in the range of $10^{20}$ cm$^{-3}$ in the case of silicon, whereas the dopant concentration of the counter-doped pocket 106 can be varied between $10^{18}$ cm$^{-3}$ to $10^{20}$ cm$^{-3}$ depending on requirements in order to allow a linear output characteristic of the planar TFET.

The band-to-band tunnel field-effect transistor (TFET) according to embodiments of the invention can also be produced in an alternative manner. In this case, the alternative production route initially proceeds according to the method steps shown in FIG. 7 to 10.

However, doping is now firstly carried out in the silicon layer 101 that is exposed after the etching. This can be achieved by ion implantation or by other diffusion processes. In the process, the doping on the source side takes place in the opposite way to the doped pocket 106 and, if applicable, the drain region 105, in this case therefore as n-doping by means of phosphorous ions (see FIG. 14). The doping may also take place as far as to the pocket, but should not cover the original doping since then there is no longer an $n^+$-$p^+$ tunnel junction. Activation can already take place directly after the doping, but can also be carried out later by the following silicidation step.

Figure 14:
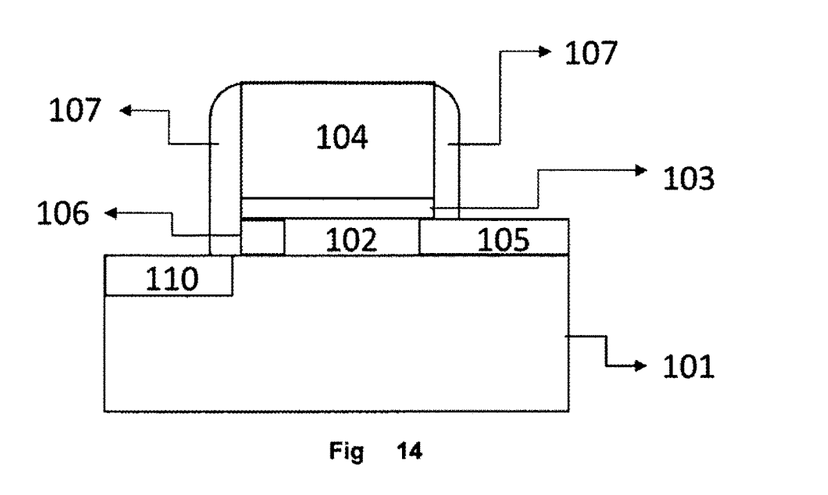

Subsequently, a metal is applied to the now n-doped silicon layer 110 by means of electron beam evaporation. In this case, suitable metals are those that react with the silicon of the Si layer but not with the SiGe layer. An additional layer can also optionally be applied thereto to protect the metal layer from oxidation.

After this, the already n-doped source region undergoes a silicidation step in which the metal diffuses out of the metal layer through the n-doped silicon layer laterally as far as into the Si layer 101 and in particular as far as to the SiGe boundary and forms a silicide; here it produces the advantageous vertical $n^+$-$p^+$ tunnel junction 111.

The aforementioned production process described by way of example can also be used for very small structures such as finFETs or nanowire TFETs having multi-gates.

A further production method is described by way of example below with reference to FIG. 15 to 21, though this should not be regarded as a limitation. In the process, the gates are arranged around the TFETs, the tunnel junction being arranged in parallel with the electric field of the gate in each case and selective silicidation and doping deposition being provided on the source side in each case by means of dopant segregation, in order to provide the tunnel junction according to embodiments of the invention.

Figure 15:
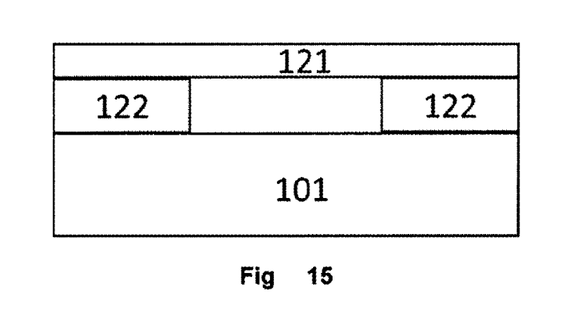
FIG. 15-21 are schematic illustrations of the production of a TFET having a nanowire according to an embodiment of the invention.

FIG. 15 shows a freestanding semiconductor nanowire 121, for example made of silicon, which is arranged on insulation layers 122, which in turn are arranged on a substrate 101. Arrays having multiple wires aligned in parallel can either be produced directly by means of lithography combined with etching processes or by nanowire growth.

Figure 16:
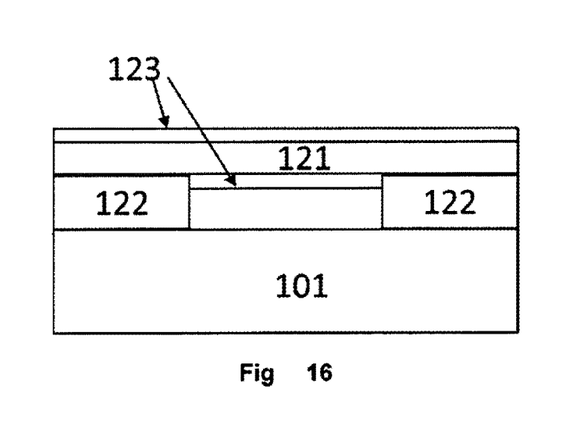

In a next step, an epitaxial layer 123 is grown conformably around the nanowire 121, for example by chemical vapor deposition. The epitaxial layer 123 can, for example, be a highly-doped semiconductor layer having a small band gap and a layer thickness of less than 10 nm. Suitable materials to be mentioned for such a layer are in particular SiGe, Ge, GeSn or SiGeSn, but other semiconductor materials can also be used according to embodiments of the invention.

Figure 17:
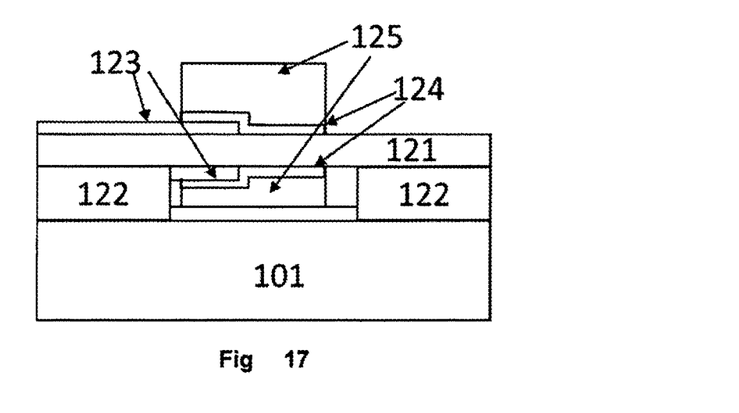

After the selective removal of the epitaxial layer on the drain side and part of the channel region, the gate arrangement is formed in an annular manner in this case as standard. To do this, firstly a gate dielectric 124 and then the gate metal 125 are applied and arranged accordingly as shown in FIG. 17.

Figure 18:
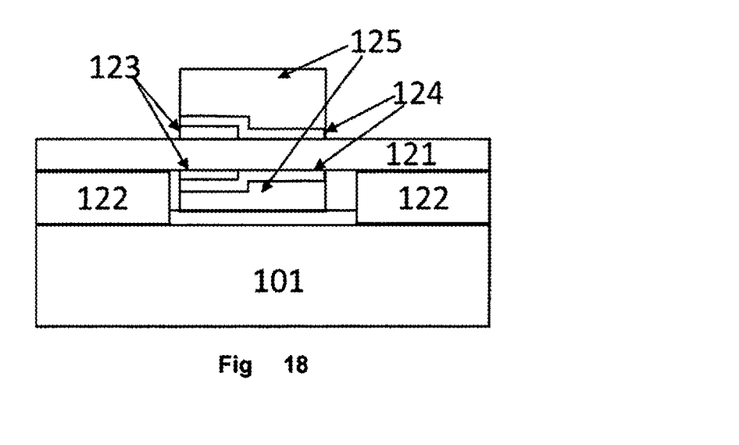

Subsequently, the epitaxial layer 123, which is not covered by the gate, is removed such that—as can be seen in FIG. 18—a circumferential doped (annular) pocket remains below the gate dielectric such that a gate-all-around (GAA) ensures the optimal electrostatic control of the component. This is particularly advantageous for tunnel FETs since particularly high field strengths can be achieved in the tunnel junction as a result of the applied gate voltage, increasing the tunnel probability and thus the drain current.

The gate arrangement is subsequently protected by laterally arranged oxide spacers 126 made of $SiO_2$ or silicon nitride.

Figure 19:
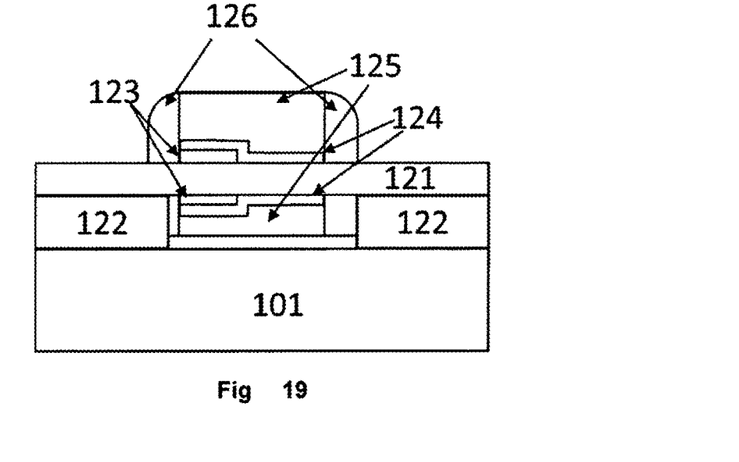

For this purpose, in the case of the arrangement according to FIG. 19, a silicided region 128 was first produced on the source side, the selective, self-adjusting silicidation only relating to the nanowire 121 and not the doped pocket 123. Silicidation can optionally also take place on the drain side. Next, the silicided region 128 is doped on the source side in the opposite way to that of the pocket and subsequently the dopants diffuse out of the silicide as far as to the pocket 123, as a result of which the highly-doped, silicided region 129 is produced.

In this case also, it is insignificant whether the highly-doped, silicided region 129 is firstly produced by selective silicidation with subsequent doping and diffusion or whether, alternatively, the region 129 is produced by firstly doping the silicon layer followed by silicidation and diffusion.

Figure 20:
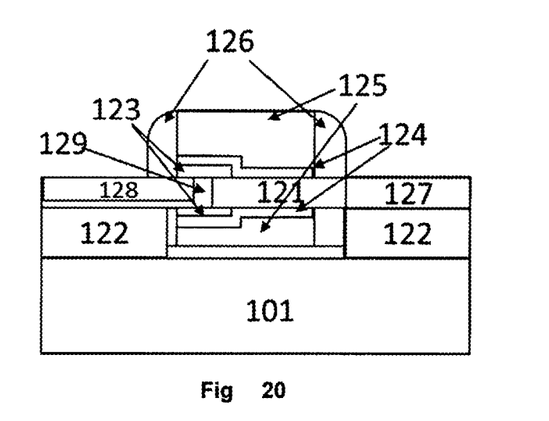

Subsequently, a doped drain region 127 is also formed by doping the nanowire 121, the doping on the drain side 127 being selected so as to be the opposite way to the doping of the highly-doped, silicided region 129.

Figure 21:
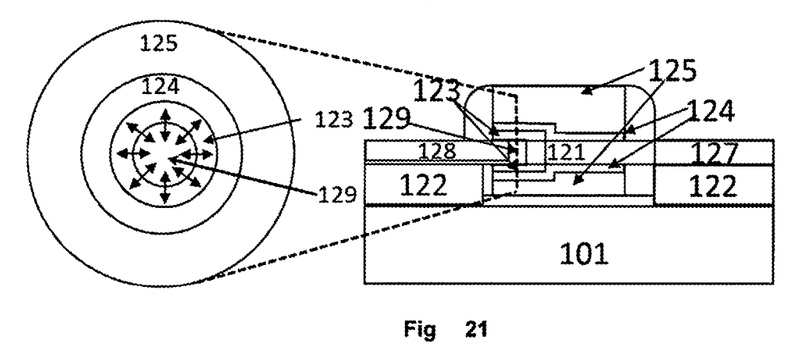

FIG. 21 is a cross section of the transistor according to the arrangement from FIG. 20. The sectional plane is indicated in FIG. 20 by a dashed line. When a gate voltage is applied, the tunneling (indicated by arrows) takes place at the boundary between the centrally arranged, highly-doped, silicided region 129 of the nanowire and the counter-doped circumferential pocket 123.

A particular feature of this starting configuration is that this almost exclusively line tunneling allows for higher tunnel currents and above all smaller subthreshold slopes (S) to be achieved in comparison to conventional embodiments having point tunneling. Such slopes are a prerequisite for higher energy efficiency of the transistors.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

101: Silicon substrate
102: Epitaxial layer, for example SiGe layer
103: Dielectric for the gate electrode
104: Gate electrode
105: Doped drain region
106: Doped pocket region
107: Laterally arranged oxide spacer, for example made from $SiO_2$ or silicon nitride
108: Silicide, for example CoSi or $CoSi_2$
109: Mask
110: Doped silicon
111: Highly-doped semiconductor region, as a result of segregation of dopants out of a region formed of silicide
121: Nanowire made of semiconductor material
122: Insulator
123: Doped epitaxial layer, for example SiGe layer, forming the pocket region
124: Dielectric for the gate electrode
125: Gate electrode
126: Laterally arranged oxide spacer, for example made of $SiO_2$ or silicon nitride
127: Doped drain region
128: Silicide, for example CoSi or $CoSi_2$
129: Highly-doped semiconductor region, as a result of segregation of dopants out of a region formed of silicide

The invention claimed is:

1. A method for producing a tunnel field-effect transistor (TFET) comprising a source region, a channel region, and a drain region, the method comprising:
   arranging an epitaxial layer on a silicon substrate;
   applying a gate arrangement having a gate electrode to the epitaxial layer, a gate dielectric being arranged between the gate electrode and the silicon substrate;
   forming a doped pocket region below the gate dielectric adjacent to the source region;
   forming a selectively silicided region in the source region, the selectively silicided region extending as far as to below a gate; and
   forming a counter-doped region doped in an opposite way to the doped pocket region adjacent to the doped pocket region in the source region by diffusion of dopants out of the selectively silicided region, as a result of which a tunnel junction parallel to electric field lines of the gate electrode is achieved.

2. The method according to claim 1, wherein at least one of Si—Ge, Ge, Ge—Sn, or Si—Ge—Sn is used for the epitaxial layer.

3. The method according to claim 1, wherein the counter-doped region is produced by selective silicidation of the source region, subsequent doping, and subsequent diffusion of the dopants.

4. The method according claim 1, wherein the counter-doped region is produced by doping the source region, subsequent selective silicidation, and subsequent diffusion of the dopants.

5. The method according to claim 1, wherein the dopants diffuse out of the selectively silicided region as far as into the doped pocket region.

6. The method according to claim 1, wherein the counter-doped region is formed so as to be self-adjusting.

7. The method according to claim 1, wherein a planar Si substrate is used and the counter-doped region is produced below the doped pocket region.

8. The method according to claim 1, wherein an Si nanowire is used and the counter-doped region is produced in the center of a circumferential doped pocket region.

9. The according to claim 1, wherein the drain region is doped identically to the doped pocket region.

10. A tunnel field-effect transistor (TFET) produced according to the method according to claim 1.

11. A tunnel field-effect transistor (TFET), comprising:
   a silicon substrate;
   an epitaxial layer arranged on the silicon substrate;
   a gate arrangement arranged on the epitaxial layer, the gate arrangement having a gate electrode and a gate dielectric arranged between the gate electrode and the silicon substrate;
   a channel arranged below the gate dielectric;
   a drain region adjacent to the channel;
   a pocket region arranged below the gate dielectric and adjacent to the channel; and
   a source region adjacent to the pocket region;
   wherein the source region includes a silicided region arranged at least partially below the gate arrangement,
   wherein the source region includes a counter-doped region doped in an opposite way to the pocket region and arranged adjacent to the pocket region at least partially below the pocket region and adjacent to the silicided region by which there is a vertical tunnel junction parallel to the electric field lines of the gate electrode, and wherein the counter-doped region is formed by dopants that have diffused out of the silicided region.

12. The tunnel field-effect transistor (TFET) according to claim 11, wherein the epitaxial layer comprises at least one of Si—Ge, Ge, Ge—Sn, or Si—Ge—Sn.

13. The tunnel field-effect transistor (TFET) according to claim 11, wherein the counter-doped region has a layer thickness of between 3 nm and 5 nm.

14. The tunnel field-effect transistor (TFET) according to claim 11, wherein the silicon substrate is planar and wherein the counter-doped region is arranged below the pocket region.

15. The tunnel field-effect transistor (TFET) according to claim 11, wherein the silicon substrate is a nanowire, wherein the pocket region is an annular pocket region, wherein the gate arrangement is arranged in an annular manner, and wherein the counter-doped region is arranged in the center of the pocket region.

16. The tunnel field-effect transistor (TFET) according to claim 15, wherein the source region, the channel region and the drain region are formed inside the nanowire.

17. The tunnel field-effect transistor (TFET) according to claim 11, wherein the pocket region has a dopant concentration of between $10^{18}$ cm$^{-3}$ and $10^{20}$ cm$^{-3}$.

18. A tunnel field-effect transistor (TFET), comprising:
a silicon substrate;
an epitaxial layer arranged on the silicon substrate;
a gate arrangement arranged on the epitaxial layer, the gate arrangement having a gate electrode and a gate dielectric arranged between the gate electrode and the silicon substrate;
a channel arranged below the gate dielectric;
a drain region adjacent to the channel;
a pocket region arranged below the gate dielectric and adjacent to the channel; and
a source region adjacent to the pocket region;
wherein the source region includes a silicided region arranged at least partially below the gate arrangement,
wherein the source region includes a counter-doped region doped in an opposite way to the pocket region and arranged adjacent to the pocket region at least partially below the pocket region and adjacent to the silicided region by which there is a vertical tunnel junction parallel to the electric field lines of the gate electrode,
wherein the counter-doped region is formed by dopants that have diffused out of the silicided region, and
wherein the silicon substrate is a nanowire, wherein the pocket region is an annular pocket region, wherein the gate arrangement is arranged in an annular manner, and wherein the counter-doped region is arranged in the center of the pocket region.

19. The TFET according to claim 18, wherein the source region, the channel region and the drain region are formed inside the nanowire.

* * * * *